United States Patent
Mimura

(10) Patent No.: US 10,797,678 B2
(45) Date of Patent: Oct. 6, 2020

(54) ACOUSTIC WAVE DEVICE, RADIO-FREQUENCY FRONT END CIRCUIT, AND COMMUNICATION DEVICE

(71) Applicant: Murata Manufacturing Co., Ltd., Nagaokakyo-shi, Kyoto-fu (JP)

(72) Inventor: Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/529,841

(22) Filed: Aug. 2, 2019

(65) Prior Publication Data

US 2019/0356296 A1  Nov. 21, 2019

Related U.S. Application Data

(63) Continuation of application No. PCT/JP2017/042424, filed on Nov. 27, 2017.

(30) Foreign Application Priority Data

Feb. 8, 2017  (JP) ................................. 2017-021162

(51) Int. Cl.
*H03H 9/145* (2006.01)
*H03H 9/25* (2006.01)
(Continued)

(52) U.S. Cl.
CPC ........... *H03H 9/02818* (2013.01); *H03F 3/21* (2013.01); *H03H 9/02637* (2013.01);
(Continued)

(58) Field of Classification Search
CPC ............... H03H 9/145; H03H 9/14517; H03H 9/14532; H03H 9/25
(Continued)

(56) References Cited

U.S. PATENT DOCUMENTS 7,863,801 B2 * 1/2011 Kadota .............. H03H 9/02834
310/313 A
8,248,186 B2 * 8/2012 Kando ..................... H03H 3/08
333/193
(Continued)

FOREIGN PATENT DOCUMENTS

JP  2009-290472 A  12/2009
JP  2012-186808 A  9/2012
(Continued)

OTHER PUBLICATIONS

Official Communication issued in International Patent Application No. PCT/JP2017/042424, dated Jan. 16, 2018.

*Primary Examiner* — Dean O Takaoka
(74) *Attorney, Agent, or Firm* — Keating & Bennett, LLP

(57) ABSTRACT

An acoustic wave device utilizes Love waves and includes a piezoelectric substrate (piezoelectric body), an IDT electrode provided on the piezoelectric substrate, and a first dielectric film that is provided on the piezoelectric substrate and covers the IDT electrode. A center region, first and second edge regions, and first and second gap regions are disposed in this order in the IDT electrode. A mass-adding film is provided inside the first dielectric film in the first edge region and the second edge region. When T1 is the film thickness of the portion of the first dielectric film located between the IDT electrode and the mass-adding film and T2 is the film thickness of the portion of the first dielectric film located between the mass-adding film and the surface of the first dielectric film on the opposite side from the piezoelectric substrate, T1/(T1+T2)<about 0.5.

20 Claims, 8 Drawing Sheets

(51) Int. Cl.
*H03H 9/02* (2006.01)
*H03F 3/21* (2006.01)

(52) U.S. Cl.
CPC ............. *H03H 9/145* (2013.01); *H03H 9/25* (2013.01); *H03F 2200/451* (2013.01)

(58) Field of Classification Search
USPC ........................................................ 333/193
See application file for complete search history.

(56) References Cited

U.S. PATENT DOCUMENTS

| | | |
|---|---|---|
| 9,148,119 B2 * | 9/2015 | Iwaki ................... H03H 9/6436 |
| 2012/0161577 A1 | 6/2012 | Abbott et al. |
| 2013/0029033 A1 | 1/2013 | Kikuchi et al. |
| 2016/0182010 A1 | 6/2016 | Nakamura et al. |
| 2019/0097601 A1 * | 3/2019 | Chen ................... H03H 9/02834 |

FOREIGN PATENT DOCUMENTS

| | | |
|---|---|---|
| JP | 2012-209841 A | 10/2012 |
| JP | 2016-119569 A | 6/2016 |
| WO | 2007/138844 A1 | 12/2007 |
| WO | 2012/124210 A1 | 9/2012 |

\* cited by examiner

ACOUSTIC WAVE DEVICE, RADIO-FREQUENCY FRONT END CIRCUIT, AND COMMUNICATION DEVICE

CROSS REFERENCE TO RELATED APPLICATIONS

This application claims the benefit of priority to Japanese Patent Application No. 2017-021162 filed on Feb. 8, 2017 and is a Continuation Application of PCT Application No. PCT/JP2017/042424 filed on Nov. 27, 2017. The entire contents of each application are hereby incorporated herein by reference.

BACKGROUND OF THE INVENTION

1. Field of the Invention

The present invention relates to an acoustic wave device that utilizes a piston mode and to a radio-frequency front end circuit, and a communication device.

2. Description of the Related Art

Heretofore, there have been proposed acoustic wave devices that utilize a piston mode in order to reduce or prevent unwanted waves.

For example, Japanese Unexamined Patent Application Publication No. 2012-186808 discloses an example of an acoustic wave device that utilizes a piston mode. An IDT electrode is provided on a piezoelectric substrate in the acoustic wave device. In addition, a dielectric layer is provided on the piezoelectric substrate and the dielectric layer covers the IDT electrode. A region in which a plurality of first electrode fingers and a plurality of second electrode fingers of the IDT electrode overlap when viewed in the acoustic wave propagation direction is called a crossing region. In the acoustic wave device disclosed in Japanese Unexamined Patent Application Publication No. 2012-186808, the crossing region includes a center region located in a central portion and edge regions located on both outer sides of the center region in a direction perpendicular to the acoustic wave propagation direction. The IDT electrode further includes gap regions on both outer sides of the edge regions of the crossing region.

The edge regions are low-acoustic-velocity regions in which the acoustic velocity is lower than the acoustic velocity in the center region. The gap regions are high-acoustic-velocity regions in which the acoustic velocity is higher than the acoustic velocity in the center region. Thus, the energy of an acoustic wave is confined and a spurious response due to a higher order transverse mode is reduced or prevented by arranging the center region, the low-acoustic-velocity regions, and the high-acoustic-velocity regions in this order.

In addition, Japanese Unexamined Patent Application Publication No. 2012-186808 discloses that the low-acoustic-velocity regions are formed by providing titanium strips inside the dielectric layer in the edge regions. The titanium strips are provided inside the dielectric layer so as to be spaced apart from the surface of the IDT electrode in the thickness direction. The film thickness of the portion of the dielectric layer between the surface of the IDT electrode and the titanium strips is about 80% of the film thickness of the portion of the dielectric layer located between the surface of the IDT electrode and the surface of the dielectric layer.

Japanese Unexamined Patent Application Publication No. 2012-186808 discloses a case in which 128° Y-cut $LiNbO_3$ is used as a piezoelectric body, that is, embodiment in which Rayleigh waves are used, and according to Japanese Unexamined Patent Application Publication No. 2012-186808, a spurious response due to a high-order transverse mode is able to be reduced under the above-described conditions. In addition, according to Japanese Unexamined Patent Application Publication No. 2012-186808, these conditions are able to be applied to all acoustic waves, such as Love waves.

However, in the case where the above-described conditions are applied while using Love waves as acoustic waves, experiments performed by the inventors of preferred embodiments of the present application made it clear that there is a problem in that a spurious response due to a high-order transverse mode is not able to be sufficiently reduced or prevented.

SUMMARY OF THE INVENTION

Preferred embodiments of the present invention provide acoustic wave devices, radio-frequency front end circuits, and communication devices that each utilize Love waves and are able to significantly reduce or prevent transverse mode spurious responses.

An acoustic wave device according to a preferred embodiment of the present invention includes a piezoelectric body; an IDT electrode provided on the piezoelectric body; and a first dielectric film provided on the piezoelectric body and covering the IDT electrode. The IDT electrode includes a first busbar and a second busbar that face each other, a plurality of first electrode fingers with first ends that are electrically connected to the first busbar, and a plurality of second electrode fingers with first ends that are electrically connected to the second busbar and that are interdigitated with the plurality of first electrode fingers. When an acoustic wave propagation direction is a first direction and a direction perpendicular or substantially perpendicular to the acoustic wave propagation direction is a second direction, the IDT electrode includes a crossing region that is a portion of the IDT electrode where the first electrode fingers and the second electrode fingers overlap in the first direction, the crossing region includes a center region located in a central portion of the first electrode fingers and the second electrode fingers in the second direction, a first edge region located outside the center region on the first busbar side in the second direction, and a second edge region located outside the center region on the second busbar side in the second direction. A first gap region is located outside the first edge region on the first busbar side in the second direction and a second gap region is located outside the second edge region on the second busbar side in the second direction. Love waves are utilized as acoustic waves. A mass-adding film is provided inside the first dielectric film in the first edge region and the second edge region. When T1 is a film thickness of a portion of the first dielectric film located between the IDT electrode and the mass-adding film and T2 is a film thickness of a portion of the first dielectric film located between the mass-adding film and a surface of the first dielectric film on an opposite side from the piezoelectric body, $T1/(T1+T2) < $ about 0.5.

In an acoustic wave device according to a preferred embodiment of the present invention, an acoustic velocity in the first edge region and the second edge region is lower than an acoustic velocity in the center region and an acoustic velocity in the first gap region and the second gap region is higher than the acoustic velocity in the first edge region and the second edge region.

In an acoustic wave device according to a preferred embodiment of the present invention, the acoustic wave device further includes a second dielectric film provided on the first dielectric film and about 0.24≤T1/(T1+T2)≤about 0.49 in the first dielectric film. In this case, transverse mode spurious responses are able to be more effectively and more reliably reduced or prevented even in the case where frequency adjustment has been performed.

In an acoustic wave device according to a preferred embodiment of the present invention, about 0.32≤T1/(T1+T2)≤about 0.44 in the first dielectric film. In this case, transverse mode spurious responses are able to be more effectively and more reliably reduced or prevented.

In an acoustic wave device according to a preferred embodiment of the present invention, a main component of the mass-adding film is Ti.

In an acoustic wave device according to a preferred embodiment of the present invention, the first dielectric film includes silicon oxide.

In an acoustic wave device according to a preferred embodiment of the present invention, the second dielectric film includes silicon nitride.

In an acoustic wave device according to a preferred embodiment of the present invention, the acoustic wave device further includes a second dielectric film provided on the first dielectric film and a thickness of the second dielectric film is in a range from about 0.005λ to about 0.015λ, where λ is a wavelength defined by an electrode finger pitch of the IDT electrode. In this case, degradation of moisture resistance is unlikely to occur and frequency adjustment is able to be efficiently performed.

A radio-frequency front end circuit according to a preferred embodiment of the present invention includes an acoustic wave device according to a preferred embodiment of the present invention and a power amplifier.

A communication device according to a preferred embodiment of the present invention includes a radio-frequency front end circuit according to a preferred embodiment of the present invention and an RF signal processing circuit.

Preferred embodiments of the present invention provide acoustic wave devices, radio-frequency front end circuits, and communication devices that each use Love waves and are able to effectively reduce or prevent transverse mode spurious responses.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
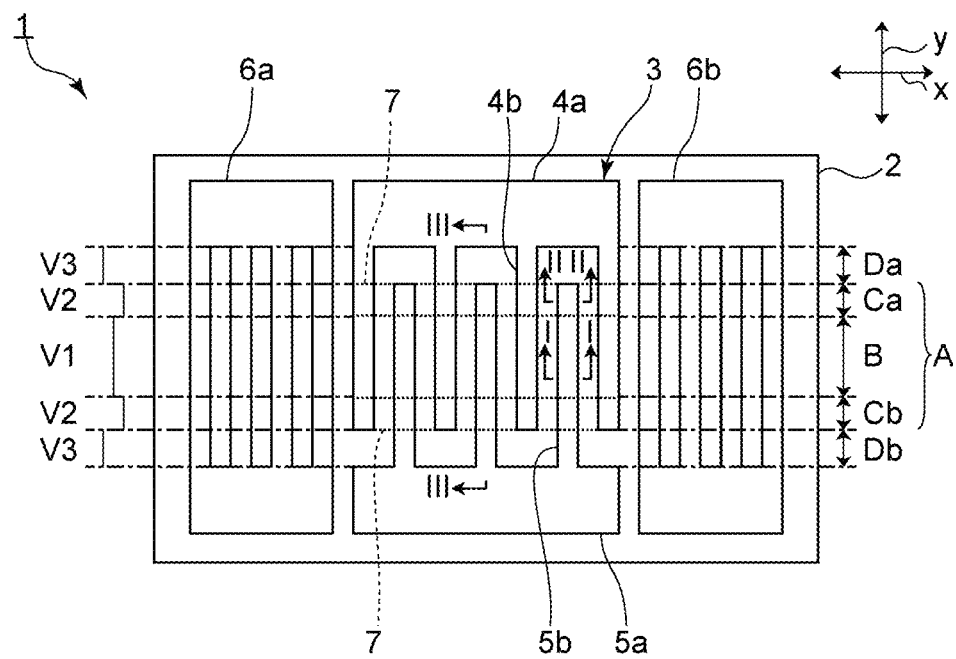
FIG. 1 is a plan view of an acoustic wave device according to a first preferred embodiment of the present invention.

Hereafter, the present invention will be made clearer by describing specific preferred embodiments of the present invention while referring to the drawings.

The preferred embodiments described in the present specification are illustrative examples and it should be noted that portions of the configurations illustrated in different preferred embodiments are able to be substituted for one another or combined with one another.

FIG. 1 is a plan view of an acoustic wave device according to a first preferred embodiment of the present invention. A first dielectric film and a second dielectric film, which will be described later, are omitted from FIG. 1.

An acoustic wave device 1 includes a piezoelectric substrate 2 as a piezoelectric body. An IDT electrode 3 is provided on the piezoelectric substrate 2. Acoustic waves are excited by applying an alternating-current voltage to the IDT electrode 3. The acoustic wave device 1 uses Love waves as acoustic waves. In the present preferred embodiment, the piezoelectric substrate 2 preferably includes 0° Y—X LiNbO$_3$, for example. However, it is sufficient that the piezoelectric substrate 2 is a piezoelectric body in which Love waves are strongly excited, and, for example, the piezoelectric substrate 2 may alternatively include −20° to 30° Y—X LiNbO$_3$ or −10° to 40° Y—X LiTaO$_3$. Upper and lower limits are included in the above examples of cut angles.

A reflector 6a and a reflector 6b are located on the two sides of the IDT electrode 3 in an acoustic wave propagation direction. The acoustic wave device of the present preferred embodiment is preferably a one-port acoustic wave resonator, for example. However, the acoustic wave device according to the present invention is not limited to being a one-port acoustic wave resonator.

As illustrated in FIG. 1, the IDT electrode 3 includes a first busbar 4a and a second busbar 5a, which face each other. The IDT electrode 3 includes a plurality of first electrode fingers 4b with first ends that are electrically connected to the first busbar 4a. The IDT electrode 3 further includes a plurality of second electrode fingers 5b with first ends that are electrically connected to the second busbar 5a.

The plurality of first electrode fingers 4b and the plurality of second electrode fingers 5b are interdigitated with each other. The IDT electrode 3 includes a crossing region A. The crossing region A is the portion of the IDT electrode 3 where the first electrode fingers 4b and the second electrode fingers 5b overlap in the acoustic wave propagation direction. Here, the acoustic wave propagation direction is taken to be a first direction x and a direction perpendicular or substantially perpendicular to the acoustic wave propagation direction is taken to be a second direction y. The crossing region A includes a center region B that is located at a central portion of the first electrode fingers 4b and the second electrode fingers 5b in the second direction y. The crossing region A includes a first edge region Ca and a second edge region Cb that are located outside the center region B in the second direction y. The first edge region Ca is located on the first busbar 4a side and the second edge region Cb is located on the second busbar 5a side.

In addition, as will be described later, the first edge region Ca and the second edge region Cb are preferably a first low-acoustic-velocity region and a second low-acoustic-velocity region in which the acoustic velocity is lower than the acoustic velocity in the center region B. In this specification, "acoustic velocity" refers to the propagation velocity of an acoustic wave in the propagation direction of the acoustic wave.

As described above, the first edge region Ca and the second edge region Cb are provided as regions with a lower acoustic velocity than the center region B. As will be described below, a mass-adding film 7 is provided above the IDT electrode 3 in the first edge region Ca and the second edge region Cb in order to significantly reduce the acoustic velocity. Here, "edges" refers to the tips of the first electrode fingers 4b of the IDT electrode 3. The first edge region Ca is a region that extends from the edges, i.e., the tips of the plurality of second electrode fingers 5b toward the center region B. The first edge region Ca includes the edges of the second electrode fingers 5b, but does not include only the portions of the IDT electrode 3 where the second electrode fingers 5b are provided, and is instead, a region of the IDT electrode 3 that extends in the acoustic wave propagation direction and has an acoustic velocity V2. In other words, the first edge region Ca includes not only the tip portions of the second electrode fingers 5b including the edges thereof but rather the entirety or substantially the entirety of a region defined by extending these tip portions in the acoustic wave propagation direction.

Conversely, the second edge region Cb includes the edges, i.e., the tips of the first electrode fingers 4b and is a region that extends from the edges toward the center region B. The second edge region Cb includes not only the tip portions, including the edges, of the first electrode fingers 4b but also the base end portions of the second electrode fingers 5b and the regions between the first and second electrode fingers 4b and 5b, and is a region that extends in the acoustic wave propagation direction inside the IDT electrode 3.

The IDT electrode 3 includes a first gap region Da that is located outside the first edge region Ca in the second direction y. The IDT electrode 3 includes a second gap region Db that is located outside the second edge region Cb in the second direction y. The first gap region Da is a region located between the first edge region Ca and the first busbar 4a. The second gap region Db is a region located between the second edge region Cb and the second busbar 5a. The gaps of the first gap region Da and the second gap region Db refer to regions between the tips of the first electrode fingers 4b and the second busbar 5a and between the second electrode fingers 5b and the first busbar 4a. These regions include gaps and are therefore referred to as the first gap region Da and the second gap region Db, but the first gap region Da and the second gap region Db include not only the gaps but rather are regions obtained by extending the gaps in the acoustic wave propagation direction inside the IDT electrode 3.

In addition, as described later, the first gap region Da and the second gap region Db are a first high-acoustic-velocity region and a second high-acoustic-velocity region in which the acoustic velocity is higher than the acoustic velocity in the center region B.

Thus, the energy of an acoustic wave is confined and spurious responses due to a high-order transverse mode are significantly reduced or prevented by arranging the center region B, the first and second low-acoustic-velocity regions, and the first and second high-acoustic-velocity regions in this order.

In addition, it is sufficient that the first high-acoustic-velocity region is provided outside the first edge region Ca on the first busbar 4a side in the second direction y and that the second high-acoustic-velocity region is provided on the second busbar 5a side of the second edge region Cb in the second direction y.

In the present preferred embodiment, the IDT electrode 3 preferably includes Cu, for example. Alternatively, the IDT electrode 3 may include a metal other than Cu. Other than Cu, a metal with a comparatively high density such as Au, Pt, W, Ta, or Mo, for example, is able to be suitably included in the IDT electrode 3. The IDT electrode 3 may preferably include a multilayer metal film in which a plurality of metal films are stacked. For example, a metal film including a metal with a comparatively low electrical resistance such as Al may be stacked on a metal film including a metal with a comparatively high density such one of the above-mentioned metals.

Figure 2:
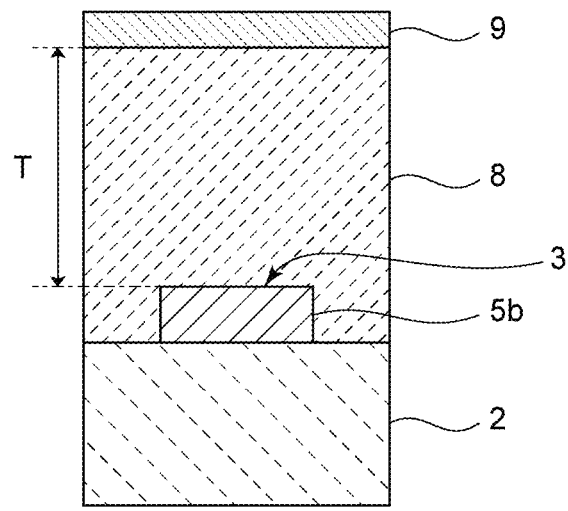
FIG. 2 is a sectional view taken along line I-I in FIG. 1.
Figure 3:
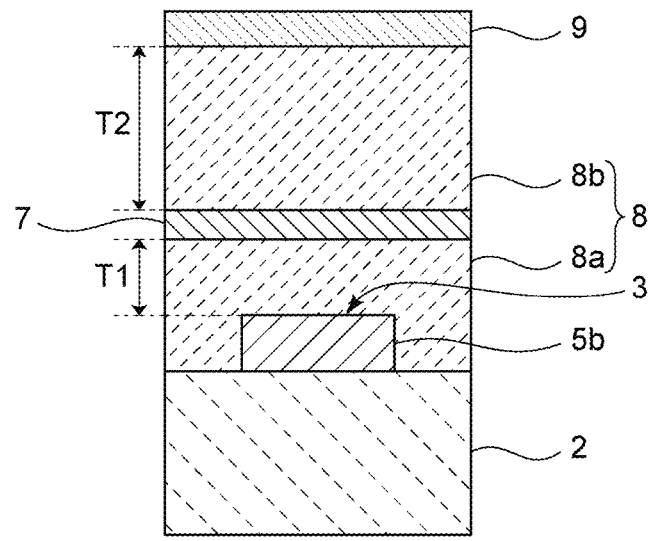
FIG. 3 is a sectional view taken along line II-II in FIG. 1.

FIG. 2 is a sectional view taken along line I-I in FIG. 1. FIG. 3 is a sectional view taken along line II-II in FIG. 1.

As illustrated in FIG. 2, a first dielectric film 8 is provided on the piezoelectric substrate 2. The first dielectric film 8 covers the IDT electrode 3. In the present preferred embodiment, the first dielectric film 8 preferably includes a silicon oxide such as SiO$_2$, for example. Thus, the absolute value of the temperature coefficient of frequency is able to be significantly reduced and the frequency-temperature characteristics are able to be significantly improved. Furthermore, the surface of the IDT electrode 3 is able to be protected and the IDT electrode 3 is unlikely to be damaged. The material of the first dielectric film 8 is not limited to the above example, and, for example, may instead be silicon oxynitride or tellurium oxide.

A second dielectric film 9 is provided on the first dielectric film 8. In the present preferred embodiment, the second dielectric film 9 preferably includes a silicon nitride such as SiN, for example. It is easy to perform frequency adjustment by adjusting the film thickness of the second dielectric film 9. The material of the second dielectric film 9 is not limited to the above example and, for example, may instead be aluminum oxide, aluminum nitride, or silicon oxynitride.

FIG. 2 illustrates a cross section of the acoustic wave device 1 taken along the first direction through the center region. FIG. 3 illustrates a cross section of the acoustic wave device 1 taken along the first direction through the first edge region. As illustrated in FIG. 3, the mass-adding film 7 is provided inside the first dielectric film 8 in the first edge region.

More specifically, the first dielectric film 8 includes a first layer 8a and a second layer 8b that is provided on the first layer 8a. The mass-adding film 7 is provided on the first layer 8a in the first edge region and the mass-adding film 7 is covered by the second layer 8b.

Here, T1 is the film thickness of the portion of the first dielectric film 8 located between the IDT electrode 3 and the mass-adding film 7 and T2 is the film thickness of the portion of the first dielectric film 8 located between the mass-adding film 7 and the surface of the first dielectric film 8 on the opposite side from the piezoelectric substrate 2. The position of the mass-adding film 7 in the thickness direction may be expressed as T1/(T1+T2). In the acoustic wave device 1, preferably, T1/(T1+T2)<about 0.5, for example. Thus, the mass-adding film 7 is located at a position that is closer to the IDT electrode 3 than to the surface of the first dielectric film 8 that is on the opposite side from the IDT electrode 3. The mass-adding film 7 is also provided in the second edge region, similar to the first edge region.

Returning to FIG. 1, the mass-adding film 7 preferably has a stripe shape that extends in the first direction x.

In a plan view, the mass-adding film 7 overlaps the plurality of first electrode fingers 4b and the plurality of second electrode fingers 5b. In addition, it is sufficient that the mass-adding film 7 overlaps at least one first electrode finger 4b or at least one second electrode finger 5b in a plan view. In the present preferred embodiment, the mass-adding film 7 preferably includes, for example, Ti as a main component. Here, "main component" means that at least about 50 wt % of the mass-adding film 7 includes Ti, and the mass-adding film 7 may include only Ti. The material of the mass-adding film 7 is not limited to the above example.

Figure 4:
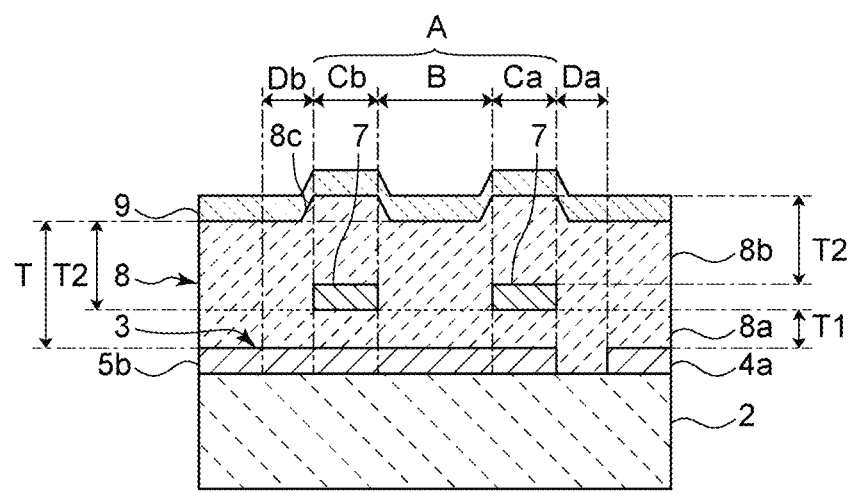
FIG. 4 is a sectional view taken along line III-III in FIG. 1.

FIG. 4 is a sectional view taken along line III-III in FIG. 1. In FIG. 4, the boundary between the first layer and the second layer is represented by a broken line.

In the present preferred embodiment, protruding portions 8c are provided on the surface of the first dielectric film 8 on the opposite side from the piezoelectric substrate 2 in the first edge region Ca and the second edge region Cb. The protruding portions 8c protrude along the shape of the mass-adding film 7. The dimension of the protruding portions 8c in the thickness direction is the same or substantially the same as the film thickness of the mass-adding film 7. "The same or substantially the same as" means identical to an extent that the filter characteristics of the acoustic wave device are not degraded. Protruding portions that protrude along the protruding portions 8c of the first dielectric film 8 are also provided on the second dielectric film 9.

In the acoustic wave device 1, a film thickness T of the first dielectric film 8 in the center region B is the sum of the film thickness T1 and the film thickness T2. Here, in this specification, the "film thickness" of the first dielectric film 8 refers to the film thickness of the portion of the first dielectric film 8 that is located on the IDT electrode 3.

The protruding portions 8c of the first dielectric film 8 and the protruding portions of the second dielectric film 9 do not have to be provided. In this case, the film thickness T would be the sum of the film thickness T1, the film thickness T2, and the film thickness of the mass-adding film 7. When a first dielectric film 8 and a second dielectric film 9 not including protruding portions are to be provided, for example, the surface of the first dielectric film 8 on the opposite side from the piezoelectric substrate 2 may planarized in the manufacturing process.

In the present preferred embodiment, the material of the piezoelectric substrate 2 and the materials and film thicknesses of the IDT electrode 3, the first dielectric film 8, the second dielectric film 9, and the mass-adding film 7 are as provided below. Here, λ represents a wavelength defined by the electrode finger pitch of the IDT electrode 3. Each film thickness is disclosed as a film thickness normalized by the wavelength λ. The film thicknesses are not limited to the values provided below.

Piezoelectric substrate: material 0° Y—X LiNbO$_3$

IDT electrode: material Cu, film thickness about 0.05λ

First dielectric film: material SiO$_2$, film thickness about 0.275λ

Second dielectric film: material SiN, film thickness about 0.01λ

Mass-adding film: material Ti, film thickness about 0.0566λ

Returning to FIG. 1, as a result of providing the mass-adding film 7 in the first edge region Ca and the second edge region Cb, the acoustic velocity of an acoustic wave is lower in the first edge region Ca and the second edge region Cb than the acoustic velocity in the center region B. Here, V1 is the acoustic velocity of an acoustic wave in the center region B and V2 is the acoustic velocity of an acoustic wave in the first edge region Ca and the second edge region Cb. At this time, preferably, V1>V2. Thus, the first edge region Ca defines the first low-acoustic-velocity region and the second edge region Cb defines the second low-acoustic-velocity region.

In the present preferred embodiment, the mass-adding film 7 preferably includes Ti, for example, but it is sufficient that the material of the mass-adding film 7 is a material with a higher density than the first dielectric film 8. The density of the mass-adding film 7 is preferably in a range from about 4000 to about 25000 kg/m$^3$, for example. If the density of the mass-adding film 7 is too low, the film thickness required to ensure that the difference in acoustic velocity between the first low-acoustic-velocity region and the second low-acoustic-velocity region and the center region has a sufficient size becomes excessively large, and therefore voids and cracks may be generated inside the first dielectric film 8 formed on the mass-adding film 7. If the density of the mass-adding film 7 is too high, the film thickness required to ensure that the acoustic velocity difference has the sufficient size becomes excessively small, and therefore film thickness variations with respect to the value of the film thickness become large and variations in the acoustic velocity difference become large.

The portions of the IDT electrode 3 located in the first gap region Da include only the first electrode fingers 4b. The portions of the IDT electrode 3 located in the second gap region Db include only the second electrode fingers 5b. Consequently, the acoustic velocity of an acoustic wave in the first gap region Da and the second gap region Db is higher than the acoustic velocity of an acoustic wave in the center region B. Here, V3 is the acoustic velocity of an acoustic wave in the first and second gap regions Da and Db. At this time, preferably, V3>V1. Thus, the first gap region Da and the second gap region Db are the first high-acoustic-velocity region and the second high-acoustic-velocity region in which the acoustic velocity is higher than the acoustic velocity in the center region B.

The first low-acoustic-velocity region and the second low-acoustic-velocity region are located outside the center region B in the second direction y and the first high-acoustic-velocity region and the second high-acoustic-velocity region are located outside the first low-acoustic-velocity region and the second low-acoustic-velocity region in the second direction y. Here, the dimensions of the first low-acoustic-velocity region and second low-acoustic-velocity region in the second direction y are the widths of the first low-acoustic-velocity region and the second low-acoustic-velocity region. The displacement distribution of an acoustic wave in the second direction y in the center region B is able to be made constant or substantially constant by adjusting the widths of the first low-acoustic-velocity region and the second low-acoustic-velocity region and the acoustic velocities V1 to V3. Spurious responses due to a high-order transverse mode are able to be significantly reduced or prevented due to a piston mode being established. Thus, the acoustic wave device 1 utilizes a piston mode. Hereafter, spurious responses due to a high-order transverse mode will be referred to as transverse mode spurious responses.

The relationship between the acoustic velocities V1 to V3 is illustrated in FIG. 1. Higher acoustic velocities are illustrated as being located further toward the left side in FIG. 1.

Features of the present preferred embodiment are that Love waves are used and the mass-adding film 7 is preferably provided at a position of T1/(T1+T2)<about 0.5, for example, inside the first dielectric film. Due to these features, transverse mode spurious responses are able to be effectively reduced or prevented. This will be explained below.

First, in an acoustic wave device utilizing a piston mode, transverse mode spurious responses are able to be effectively reduced or prevented when the acoustic velocity ratio V2/V1 between the first low-acoustic-velocity region, the second low-acoustic-velocity region, and the center region B is less than or equal to about 0.98. This will be described below.

A normalized overlap integral value of the fundamental mode, as described in Japanese Unexamined Patent Application Publication (Translation of PCT Application) No. 2013-518455, is used as an indicator of the size of the advantageous effect of reducing or preventing transverse mode spurious responses achieved by a piston mode. Transverse mode spurious responses are reduced or prevented to a greater degree the closer the integral value is to 1.

The relationship between the acoustic velocity ratio V2/V1 and the normalized overlap integral value of the fundamental mode was obtained under the following conditions. Here, a dimension of the crossing region that extends in the second direction y is referred to a crossing width.

Crossing width: about 10λ

Acoustic velocity ratio V3/V1 between first high-acoustic-velocity region and second high-acoustic-velocity region, and center region: about 1.08

Anisotropy coefficient (1+Γ in below Formula [1]): about 1.24

Widths of first low-acoustic-velocity region and second low-acoustic-velocity region: set in accordance with below Formula [1]

Formula [1] below is a formula expressed as Formula [Math. 5] in Japanese Unexamined Patent Application Publication (Translation of PCT Application) No. 2013-518455 (International Publication No. WO2011/088904).

$$W = \frac{V_{ZAB}}{2\pi f} |\sqrt{1+\Gamma}| \frac{\arctan\sqrt{\frac{\Delta v_{AB}}{\Delta v_{RB}}}}{\sqrt{2\frac{\Delta v_{RB}}{v_{ZAB}}}} \quad [\text{Math. 1}]$$

The value of the anisotropy coefficient is a value obtained in a case where 0° Y—X LiNbO$_3$ is included as the piezoelectric substrate and Love waves are utilized as in the present preferred embodiment.

Under these conditions, changes in the displacement distribution of the fundamental mode in the second direction y were obtained while changing the acoustic velocity ratio V2/V1. As a result of acquiring the normalized overlap integral values of the fundamental mode using these changes, the relationship illustrated in FIG. 5 was obtained.

Figure 5:
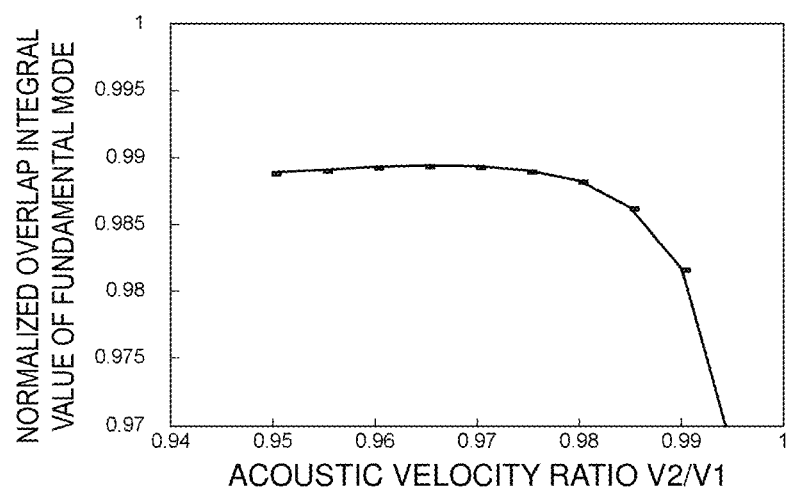
FIG. 5 is a diagram illustrating the relationship between the normalized overlap integral value of the fundamental mode and an acoustic velocity ratio V2/V1.

FIG. 5 is a diagram illustrating the relationship between the normalized overlap integral value of the fundamental mode and the acoustic velocity ratio V2/V1.

As illustrated in FIG. 5, under a condition that the acoustic velocity ratio V2/V1 is less than or equal to about 0.98, the normalized overlap integral value of the fundamental mode is about 0.989, i.e., a value that is close to 1 and is constant or substantially constant. However, once the acoustic velocity ratio V2/V1 becomes larger than about 0.98, the integral value rapidly decreases. Therefore, transverse mode spurious responses are able to be effectively reduced or prevented under a condition of an acoustic velocity ratio V2/V1 of less than or equal to about 0.98.

Next, the relationship between the thickness direction position T1/(T1+T2) of the mass-adding film inside the first dielectric film and the acoustic velocity ratio V2/V1 was obtained. The conditions were as follows.

Piezoelectric substrate: material 0° Y—X LiNbO$_3$

IDT electrode: material Cu, film thickness about 0.05λ

First dielectric film: material SiO$_2$, film thickness about 0.275λ

Second dielectric film: material SiN, film thickness about 0.01λ

Mass-adding film: material Ti, film thickness about 0.0566λ

Utilized acoustic waves: Love waves

Figure 6:
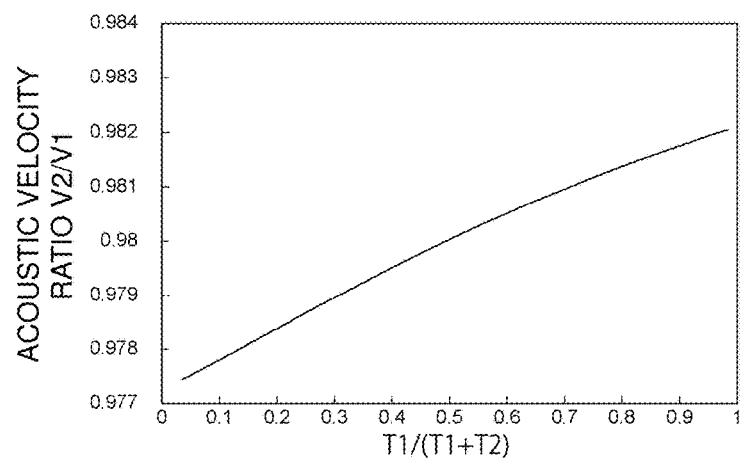
FIG. 6 is a diagram illustrating the relationship between a position T1/(T1+T2) of a mass-adding film in a thickness direction inside a first dielectric film and the acoustic velocity ratio V2/V1.

FIG. 6 is a diagram illustrating the relationship between the thickness direction position T1/(T1+T2) of the mass-adding film inside the first dielectric film and the acoustic velocity ratio V2/V1.

As illustrated in FIG. 6, it is clear that the acoustic velocity ratio V2/V1 is less than or equal to about 0.98 when the position T1/(T1+T2) of the mass-adding film in the thickness direction inside the first dielectric film is less than about 0.5.

Therefore, the acoustic velocity ratio V2/V1 is less than or equal to about 0.98 and transverse mode spurious responses are able to be effectively reduced or prevented by providing the mass-adding film at a position T1/(T1+T2) of <about 0.5 inside the first dielectric film.

This advantageous effect is unique to the case where Love waves are used. This will be explained below.

Figure 7:
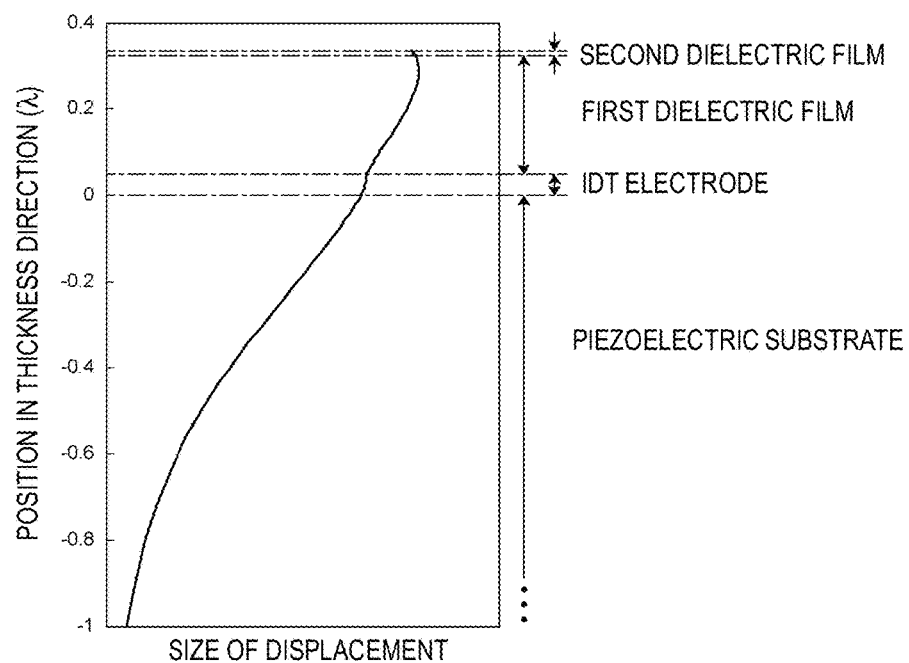
FIG. 7 is a diagram illustrating a thickness direction displacement distribution at a resonant frequency in the case where Rayleigh waves are used.
Figure 8:
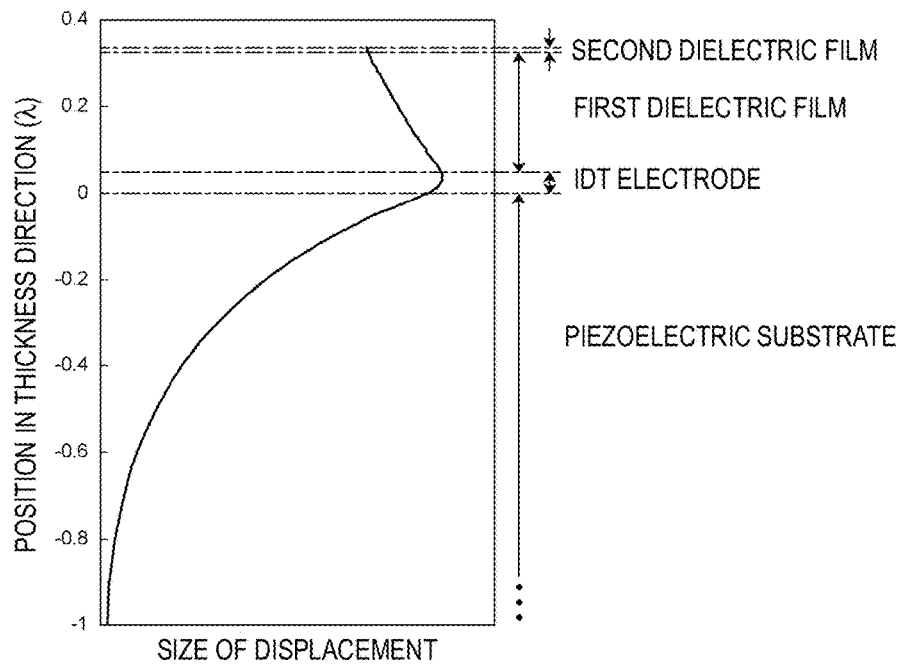
FIG. 8 is a diagram illustrating a thickness direction displacement distribution at a resonant frequency in the case where Love waves are used.

The relationship illustrated in FIG. 6 for the acoustic wave device 1 utilizing Love waves is very different from that for a case where Rayleigh waves are utilized. This is because the displacement distributions in the thickness direction are very different from each other in the case where Love waves are utilized and the case where Rayleigh waves are utilized. FIGS. 7 and 8 illustrate the displacement distribution in a comparative example in which Rayleigh waves are used and the displacement distribution in the present preferred embodiment. The acoustic wave device of the comparative example differs from that of the first preferred embodiment in that the piezoelectric substrate is made of 128° Y—X LiNbO$_3$ in which Rayleigh waves are strongly excited.

FIG. 7 is a diagram illustrating the thickness direction displacement distribution at the resonant frequency in the case where Rayleigh waves are used. FIG. 8 is a diagram illustrating the thickness direction displacement distribution at the resonant frequency in the case where Love waves are used. The displacements illustrated in FIGS. 7 and 8 are displacements in a portion where the mass-adding film is not provided. The position of the surface of the piezoelectric substrate on which the IDT electrode is provided is used as a reference for positions in the thickness direction.

As illustrated in FIG. 7, displacement caused by Rayleigh waves is maximized in the vicinity of the surface of the first dielectric film on the opposite side from the piezoelectric substrate. In contrast, as illustrated in FIG. 8, displacement caused by Love waves is maximized in the vicinity of the IDT electrode. The effect of the acoustic velocity being significantly reduced is increased by locating the mass-adding film at a position where displacement is large. Therefore, in contrast to the comparative example in which Rayleigh waves are used, in the present preferred embodiment in which Love waves are used, the acoustic velocity ratio V2/V1 is able to be made smaller the closer the mass-adding film is located to the IDT electrode.

In other words, in the present preferred embodiment in which Love waves are used, the acoustic velocity ratio V2/V1 is able to be made small and transverse mode spurious responses are able to be reduced or prevented by locating the mass-adding film inside the first dielectric film at a position inside the first dielectric film that is closer to the IDT electrode than to the second dielectric film.

As described above, the acoustic wave device 1 includes the second dielectric film. When manufacturing the acoustic wave device 1, frequency adjustment is performed by adjusting the film thickness of the second dielectric film. Here, the mass-adding film is provided in the first low-acoustic-velocity region and the second low-acoustic-velocity region and the mass-adding film is not provided in the center region. Therefore, the relative size of a change in the acoustic velocity V2 in the first low-acoustic-velocity region and the second low-acoustic-velocity region and the relative size of a change in the acoustic velocity V1 in the center region with respect to a change in the film thickness of the second dielectric film may be different from each other. Therefore, the acoustic velocity ratio V2/V1 may be changed by adjustment of the film thickness of the second dielectric film. The change in the acoustic velocity ratio V2/V1 caused by the film thickness of the second dielectric film being changed is preferably small. Thus, preferable or optimum conditions for a piston mode are able to be achieved more reliably and transverse mode spurious responses are able to be reduced or prevented more reliably.

The film thickness of the second dielectric film after frequency adjustment preferably lies in a range from about 0.005λ to about 0.015λ, for example. In the case where the second dielectric film includes SiN or the like, the second dielectric film also defines and functions as a moisture resistant protective film. If the film thickness of the second dielectric film after frequency adjustment is too small, there is a risk of the moisture resistance of the second dielectric film being degraded. On the other hand, if the film thickness of the second dielectric film is too large, the change in frequency with respect to a change in film thickness is small and there is a risk of it being difficult to efficiently perform frequency adjustment.

Figure 9:
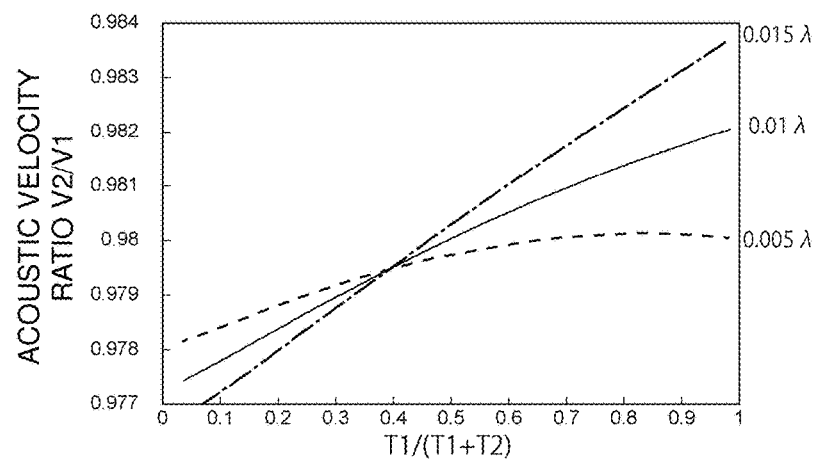
FIG. 9 is a diagram illustrating the relationship between the film thickness of a second dielectric film, the thickness direction position T1/(T1+T2) of the mass-adding film inside the first dielectric film, and the acoustic velocity ratio V2/V1.

Here, together with the results illustrated in FIG. 6, the relationships between the position of the mass-adding film and the acoustic velocity ratio V2/V1 in the cases where the film thickness of the second dielectric film is about 0.005λ and about 0.015λ are illustrated in FIG. 9.

FIG. 9 is a diagram illustrating the relationship between the film thickness of the second dielectric film, the thickness direction position T1/(T1+T2) of the mass-adding film inside the first dielectric film, and the acoustic velocity ratio V2/V1. In FIG. 9, a solid line illustrates the results for when the film thickness of the second dielectric film is about 0.01λ. A broken line illustrates the results for when the film thickness of the second dielectric film is about 0.005λ. A one-dot chain line illustrates the results for when the film thickness of the second dielectric film is about 0.015λ.

As illustrated in FIG. 9, in the case where the position T1/(T1+T2) of the mass-adding film in the thickness direction is about 0.4, it is clear that the acoustic velocity ratio V2/V1 is constant or substantially constant regardless of the film thickness of the second dielectric film. Therefore, it is preferable that T1/(T1+T2)=about 0.4, for example. In this case, the acoustic velocity ratio V2/V1 substantially does not change even when frequency adjustment has been performed. Therefore, preferable or optimum conditions for a piston mode are able to be more reliably achieved in the acoustic wave device 1. Therefore, transverse mode spurious is able to be effectively and more reliably reduced or prevented.

On the other hand, in the case where the position T1/(T1+T2) of the mass-adding film in the thickness direction has a value other than about 0.4, the acoustic velocity ratio V2/V1 changes when the film thickness of the second dielectric film is changed. For example, as illustrated in FIG. 9, in the case where T1/(T1+T2)=about 0.109, the acoustic velocity ratio V2/V1 is about 0.9773 when the film thickness of the second dielectric film is about 0.015λ and the acoustic velocity ratio V2/V1 is about 0.9784 when the film thickness is about 0.005λ. Therefore, in the case where T1/(T1+T2)=about 0.109, the acoustic velocity ratio V2/V1 is changed in the range from about 0.9773 to about 0.9784 by adjusting the film thickness of the second dielectric film. The smaller the change in acoustic velocity ratio V2/V1 resulting from a difference in film thickness of the second dielectric film, the less likely it is that the acoustic wave device 1 will deviate from the preferable or optimum conditions for a piston mode. The change in the acoustic velocity ratio V2/V1 becomes smaller and transverse mode spurious responses are able to be reduced or prevented more reliably as the position T1/(T1+T2) of the mass-adding film in the thickness direction approaches 0.4.

Here, the preferable range of the position of the mass-adding film in the thickness direction was investigated in more detail. The relationship between the acoustic velocity ratio V2/V1 and the normalized overlap integral value of the fundamental mode was obtained by changing the thickness direction position T1/(T1+T2) of the mass-adding film. The conditions were as follows.

Crossing width: about 10λ
Acoustic velocity ratio V3/V1: about 1.08
Anisotropy coefficient (1+Γ): about 1.24
Width of first low-acoustic-velocity region and second low-acoustic-velocity region: value obtained using above Formula [Math. 1] (refer to Formula [Math. 5] in Japanese Unexamined Patent Application Publication (Translation of PCT Application) No. 2013-518455) using the acoustic velocity ratio in the case where the second dielectric film includes SiN and the film thickness is about 0.01λ.

Figure 10:
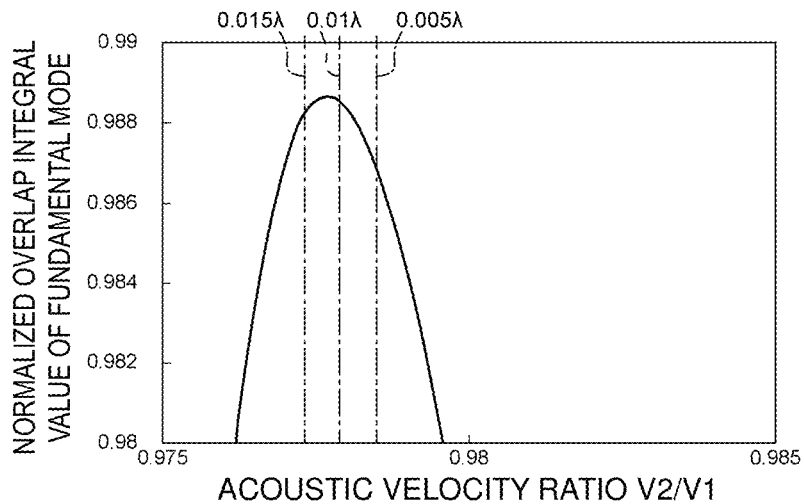
FIG. 10 is a diagram illustrating the relationship between the acoustic velocity ratio V2/V1 and the normalized overlap integral value of the fundamental mode in the case where the thickness direction position T1/(T1+T2) of the mass-adding film is about 0.109.
Figure 11:
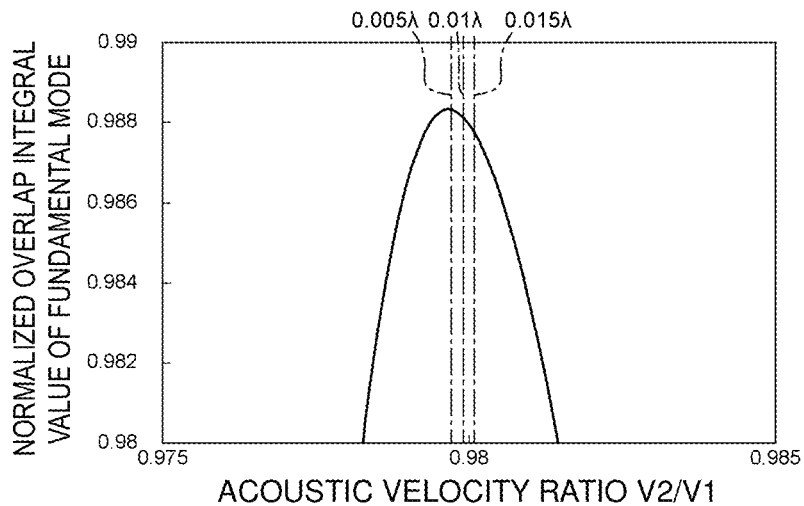
FIG. 11 is a diagram illustrating the relationship between the acoustic velocity ratio V2/V1 and the normalized overlap integral value of the fundamental mode in the case where the thickness direction position T1/(T1+T2) of the mass-adding film is about 0.473.

FIGS. 10 and 11 illustrate the obtained relationships between the acoustic velocity ratio V2/V1 and the normalized overlap integral value of the fundamental mode. The position T1/(T1+T2) of the mass-adding film in the thickness direction was about 0.109 and about 0.473.

FIG. 10 is a diagram illustrating the relationship between the acoustic velocity ratio V2/V1 and the normalized overlap integral value of the fundamental mode in the case where the position T1/(T1+T2) of the mass-adding film in the thickness direction is about 0.109. FIG. 11 is a diagram illustrating the relationship between the acoustic velocity ratio V2/V1 and the normalized overlap integral value of the fundamental mode in the case where the position T1/(T1+T2) of the mass-adding film in the thickness direction is about 0.473. The one-dot chain lines in FIG. 10 illustrate the acoustic velocity ratios V2/V1 obtained when the film thickness of the second dielectric film is about 0.005λ, about 0.01λ, and about 0.015λ. The same is true for the one-dot chain lines in FIG. 11.

As illustrated in FIG. 10, in the case where the position T1/(T1+T2) of the mass-adding film in the thickness direction is about 0.109, when the film thickness of the second dielectric film lies in the preferable range, the minimum value of the normalized overlap integral value of the fundamental mode is about 0.9869 when the film thickness is about 0.005λ, which is a comparatively large value.

On the other hand, as illustrated in FIG. 11, in the case where the position T1/(T1+T2) of the mass-adding film in the thickness direction is about 0.473, it is clear that the change in the acoustic velocity ratio V2/V1 is small with respect to the change of the film thickness of the second dielectric film. Therefore, the minimum value of the normalized overlap integral value of the fundamental mode when the film thickness of the second dielectric film is in the preferable range is about 0.9878 when the film thickness is about 0.015λ, for example, and the normalized overlap integral value of the fundamental mode is able to be made larger over the entire or substantially the entire range.

A similar investigation was performed by changing the position T1/(T1+T2) of the mass-adding film in the thickness direction, and the minimum values of the normalized overlap integral value of the fundamental mode when the film thickness of the second dielectric film was in the preferable range were obtained.

Figure 12:
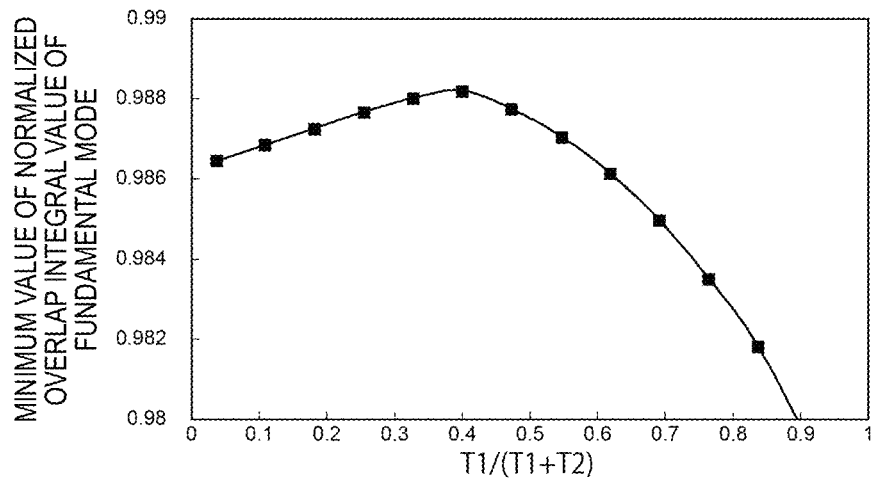
FIG. 12 is a diagram illustrating the relationship between the minimum value of the normalized overlap integral value of the fundamental mode and the thickness direction position T1/(T1+T2) of the mass-adding film in the case where the film thickness of the second dielectric film is in a range from about 0.005λ to about 0.015λ.

FIG. 12 is a diagram illustrating the relationship between the minimum value of the normalized overlap integral value of the fundamental mode and the position T1/(T1+T2) of the mass-adding film in the thickness direction when the film thickness of the second dielectric film is in a range from about 0.005λ to about 0.015λ.

As illustrated in FIG. 12, it is clear that a large minimum value is able to be obtained for the normalized overlap integral value of the fundamental mode as the position T1/(T1+T2) of the mass-adding film in the thickness direction approaches about 0.4. It is preferable that the position of the mass-adding film in the thickness direction lies within a range of about 0.24≤T1/(T1+T2)≤about 0.49, for example. As a result, the normalized overlap integral value of the fundamental mode is able to be made greater than or equal to about 0.9876. It is more preferable that the position of the mass-adding film in the thickness direction lies within a range of about 0.32≤T1/(T1+T2)≤about 0.44, for example. As a result, the normalized overlap integral value of the fundamental mode is able to be made greater than or equal to about 0.9880 and the integral value is able to be made even closer to 1. Therefore, transverse mode spurious responses are able to be more effectively and more reliably reduced or prevented.

In the first preferred embodiment illustrated in FIG. 1, the first high-acoustic-velocity region and the second high-acoustic-velocity region are provided between the first busbar 4a and the first edge region Ca and between the second busbar 5a and the second edge region Cb. The first high-acoustic-velocity region and the second high-acoustic-velocity region may instead be provided inside the first busbar 4a and inside the second busbar 5a.

Figure 13:
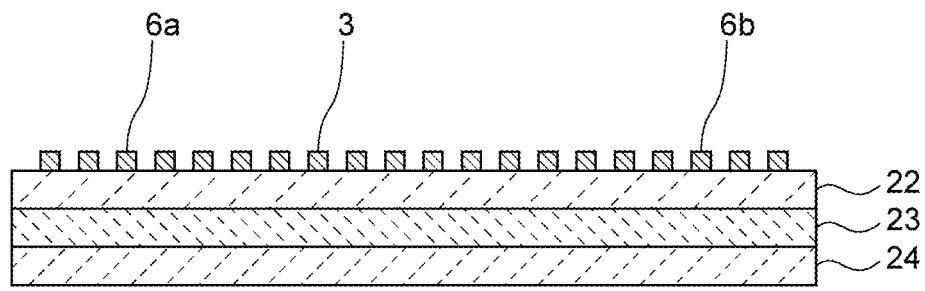
FIG. 13 is a front sectional view of an acoustic wave device according to a modification of the first preferred embodiment of the present invention.

The piezoelectric body is the piezoelectric substrate 2 in the first preferred embodiment, but the piezoelectric body may instead be a piezoelectric thin film 22 as in a modification of the first preferred embodiment illustrated in FIG. 13. For example, a low-acoustic-velocity film 23 may be provided on the surface of the piezoelectric thin film 22 on the opposite side from the surface of the piezoelectric thin film 22 on which the IDT electrode 3 is provided. A high-acoustic-velocity member 24 may be provided on a surface of the low-acoustic-velocity film 23 on the opposite side from the piezoelectric thin film 22.

Here, the low-acoustic-velocity film 23 is a film in which the acoustic velocity of a propagating bulk wave is lower than the acoustic velocity of an acoustic wave propagating along the piezoelectric thin film 22. For example, the low-acoustic-velocity film 23 preferably includes a material including a main component that is, for example, silicon oxide, glass, silicon oxynitride, tantalum oxide, or a compound obtained by adding fluorine, carbon, or boron to silicon oxide. It is sufficient that the material of the low-acoustic-velocity film 23 is a material with a relatively low acoustic velocity.

The high-acoustic-velocity member 24 is a member in which the acoustic velocity of a propagating bulk wave is higher than the acoustic velocity of an acoustic wave propagating along the piezoelectric thin film 22. For example, the high-acoustic-velocity member 24 preferably includes, for example, a material including aluminum nitride, aluminum oxide, silicon carbide, silicon oxynitride, silicon, a DLC film or diamond as a main component. In addition, it is sufficient that the material of the high-acoustic-velocity member 24 be a material with a relatively high acoustic velocity.

The high-acoustic-velocity member 24 may be a high-acoustic-velocity film or may be a high-acoustic-velocity substrate. When the low-acoustic-velocity film 23 and the high-acoustic-velocity member 24 are provided in this way, the energy of acoustic waves is able to be effectively confined.

Hereafter, a non-limiting example of a method of manufacturing the acoustic wave device 1 of the present preferred embodiment will be described.

Figure 14A:
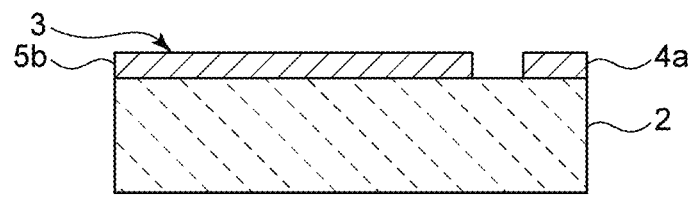
FIGS. 14A to 14C are sectional views of a non-limiting example of a method of manufacturing the acoustic wave device of the first preferred embodiment and correspond to a portion extending along line III-III in FIG. 1.
Figure 14B:
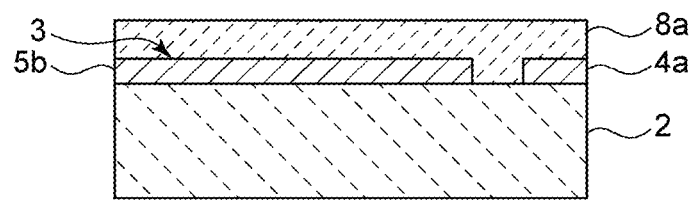
Figure 14C:
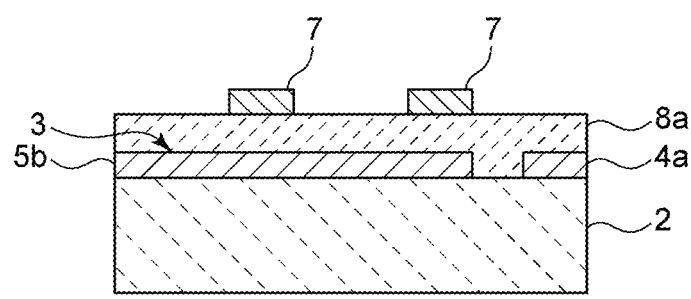
Figure 15A:
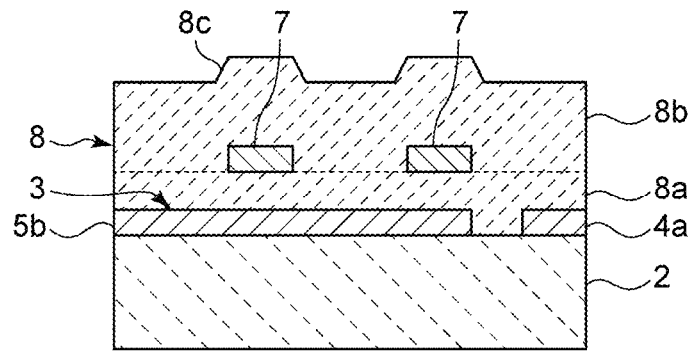
FIGS. 15A and 15B are sectional views of the non-limiting example of a method of manufacturing the acoustic wave device of the first preferred embodiment and correspond to a portion extending along line III-III in FIG. 1.
Figure 15B:
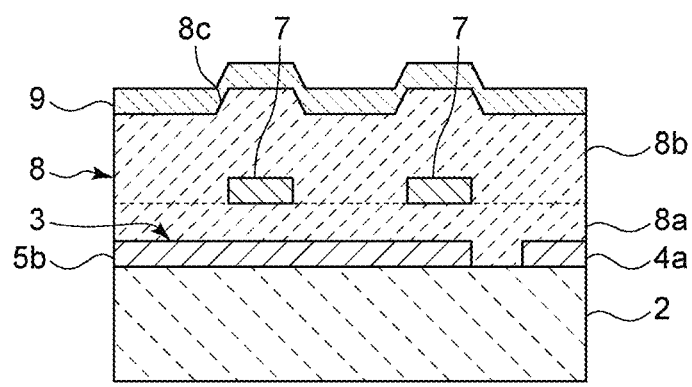

FIGS. 14A to 14C are sectional views of an example of a method of manufacturing the acoustic wave device of the first preferred embodiment and correspond to a portion extending along line III-III in FIG. 1. FIGS. 15A and 15B are sectional views of the example of a method of manufacturing the acoustic wave device of the first preferred embodiment and correspond to a portion extending along line in FIG. 1. In FIGS. 15A and 15B, the boundary between the first layer and the second layer is represented by a broken line.

As illustrated in FIG. 14A, the piezoelectric substrate 2 is prepared. Next, the IDT electrode 3 is formed on the piezoelectric substrate 2. The IDT electrode 3 is able to be formed by a sputtering method or a vapor deposition method, for example.

Next, as illustrated in FIG. 14B, the first layer 8a is formed on the piezoelectric substrate 2 and covers the IDT electrode 3. The first layer 8a is able to be formed by a sputtering method, for example. At this time, protruding portions that follow the shape of the IDT electrode 3 are formed on the surface of the first layer 8a on the opposite side from the piezoelectric substrate 2. Next, the surface of the first layer 8a is planarized. In this way, the protruding portions are removed and the film thickness of the first layer 8a is adjusted. The surface of the first layer 8a does not necessarily have to be planarized. In this case, it is sufficient that the film thickness of the first layer 8a is adjusted when forming the first layer 8a. The film thickness of the portion of the first layer 8a above the IDT electrode 3 corresponds to the film thickness T1 illustrated in FIG. 3.

Next, as illustrated in FIG. 14C, the mass-adding film 7 is formed on the first layer 8a. The mass-adding film 7 is formed in the first edge region and the second edge region. When forming the mass-adding film 7, the film that will form the mass-adding film 7 is formed on the first layer 8a by a sputtering method or a vapor deposition method, for example. Next, the film that will form the mass-adding film 7 is patterned by a photolithography method or by performing etching, for example. Alternatively, the mass-adding film 7 may be formed by a lift off method.

Next, as illustrated in FIG. 15A, the second layer 8b is formed on the first layer 8a and covers the mass-adding film 7. The second layer 8b is able to be formed by a sputtering method, for example. Thus, the first dielectric film 8 is able to be formed and the mass-adding film 7 is able to be located inside the first dielectric film 8. At this time, the protruding portions 8c that follow the shape of the IDT electrode 3 are formed on the surface of the first dielectric film 8 on the side opposite from the piezoelectric substrate 2.

Figure 16A:
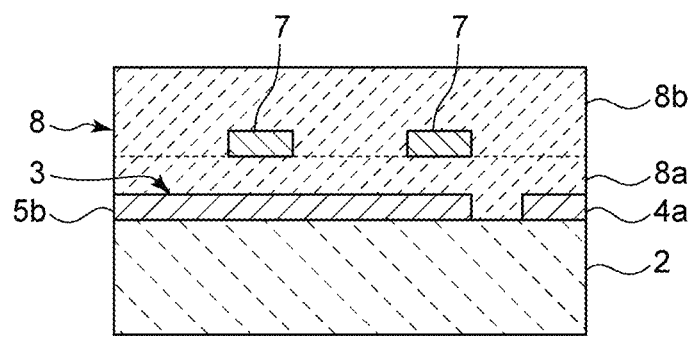
FIGS. 16A and 16B are sectional views of a modification of the manufacturing method illustrated in FIGS. 15A and 15B and correspond to a portion extending along line III-III in FIG. 1.
Figure 16B:
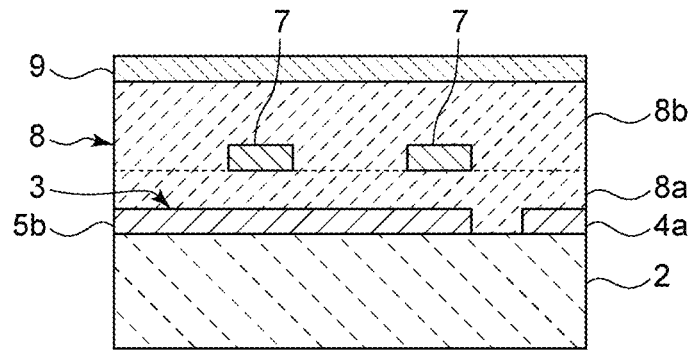

Next, as illustrated in FIG. 15B, the second dielectric film 9 is stacked on the first dielectric film 8. In addition, as illustrated in FIGS. 16A and 16B, after the step illustrated in FIG. 15A, the surface of the first dielectric film 8 on the opposite side from the piezoelectric substrate 2 may be planarized and after that the second dielectric film 9 may be formed on the first dielectric film 8.

In the first preferred embodiment and the modification of the first preferred embodiment, an example was described in which the acoustic wave device is a one-port acoustic wave resonator. The present invention is able to also be appropriately applied to acoustic wave devices other than a one-port acoustic wave resonator.

The above-described acoustic wave device is able to be provided in a duplexer of a radio-frequency front end circuit, for example. An example of this will be described hereafter.

Figure 17:
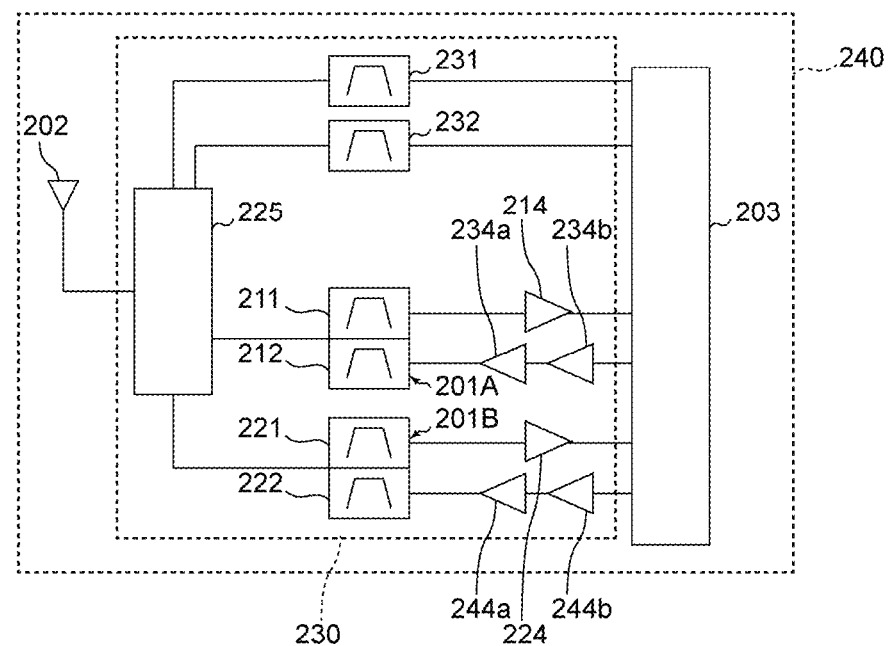
FIG. 17 is a diagram of a communication device that includes a radio-frequency front end circuit.

FIG. 17 is a diagram of a communication device that includes a radio-frequency front end circuit.

In FIG. 17, components and elements electrically connected to a radio-frequency front end circuit 230, such as an antenna element 202 and an RF signal processing circuit (RFIC) 203, are also illustrated. The radio-frequency front end circuit 230 and the RF signal processing circuit 203 define a communication device 240. The communication device 240 may further include a power source, a CPU, and a display, for example.

The radio-frequency front end circuit 230 includes a switch 225, duplexers 201A and 201B, filters 231 and 232, low-noise amplifier circuits 214 and 224, and power amplifier circuits 234a, 234b, 244a, and 244b. The radio-frequency front end circuit 230 and the communication device 240 illustrated in FIG. 17 are merely examples of a radio-frequency front end circuit and a communication device, and the present invention is not limited to these configurations.

The duplexer 201A includes filters 211 and 212. The duplexer 201B includes filters 221 and 222. The duplexers 201A and 201B are electrically connected to the antenna element 202 via the switch 225. The above-described acoustic wave devices according to preferred embodiments of the present invention may be applied to the duplexers 201A and 201B and the filters 211, 212, 221, and 222. The above-described acoustic wave devices according to preferred embodiments of the present invention may be acoustic wave resonators defining the duplexers 201A and 201B and the filters 211, 212, 221, and 222.

In addition, the above-described acoustic wave devices according to preferred embodiments of the present invention are also able to be applied to a multiplexer including, for example, three or more filters, such as a triplexer in which the antenna terminals of three filters are commonly connected to each other or a hexaplexer in which the antenna terminals of six filters are commonly connected to each other.

In other words, the above-described acoustic wave devices according to preferred embodiments of the present invention may be applied to an acoustic wave resonator, a filter, a duplexer, and a multiplexer including three or more filters. In addition, such a multiplexer is not limited to a configuration that includes both a transmission filter and a reception filter, and may instead include only a transmission filter or only a reception filter.

The switch 225 electrically connects the antenna element 202 and a signal path corresponding to a prescribed band to each other in accordance with a control signal from a controller (not illustrated), and is preferably, for example, defined by a single pole double throw (SPDT) switch. In addition, the number of signal paths connected to the antenna element 202 is not limited to one and may be a plurality. In other words, the radio-frequency front end circuit 230 may support carrier aggregation.

The low-noise amplifier circuit 214 is a reception amplification circuit that amplifies a radio-frequency signal (in this case, a radio-frequency reception signal) received via the antenna element 202, the switch 225, and the duplexer 201A and outputs the amplified signal to the RF signal processing circuit 203. The low-noise amplifier circuit 224 is a reception amplification circuit that amplifies a radio-frequency signal (in this case, a radio-frequency reception signal) received via the antenna element 202, the switch 225, and the duplexer 201B and outputs the amplified signal to the RF signal processing circuit 203.

The power amplifier circuits 234a and 234b are transmission amplification circuits that amplify a radio-frequency signal (here, radio-frequency transmission signal) output from the RF signal processing circuit 203 and output the amplified radio-frequency signal to the antenna element 202 via the duplexer 201A and the switch 225. The power amplifier circuits 244a and 244b are transmission amplification circuits that amplify a radio-frequency signal (here, radio-frequency transmission signal) output from the RF signal processing circuit 203 and output the amplified radio-frequency signal to the antenna element 202 via the duplexer 201B and the switch 225.

The RF signal processing circuit 203 subjects a radio-frequency reception signal input thereto from the antenna element 202 via a reception signal path to signal processing with down conversion and the like, and outputs a reception signal generated through this signal processing. In addition, the RF signal processing circuit 203 subjects an input transmission signal to signal processing with up conversion and the like and outputs a radio-frequency transmission signal generated through this signal processing to the low-noise power amplifier circuit 224. The RF signal processing circuit 203 is an RFIC, for example. In addition, the communication device may include a baseband (BB) IC. In this case, the BBIC subjects a reception signal processed by the RFIC to signal processing. Furthermore, the BBIC subjects a transmission signal to signal processing and outputs the resulting signal to an RFIC. A reception signal processed by the BBIC or a transmission signal prior to being subjected to signal processing by the BBIC is an image signal, an audio signal, or the like, for example. The radio-frequency front end circuit 230 may include other circuit elements between the above-described components and elements.

Furthermore, the radio-frequency front end circuit 230 may include duplexers according to modifications of the duplexers 201A and 201B, instead of the duplexers 201A and 201B.

On the other hand, the filters 231 and 232 of the communication device 240 are electrically connected between the RF signal processing circuit 203 and the switch 225 without the low-noise amplifier circuits 214 and 224 or power amplifier circuits 234a, 234b, 244a, and 244b located therebetween. The filters 231 and 232 are also electrically connected to the antenna element 202 via the switch 225 similarly to the duplexers 201A and 201B.

The high-frequency front end circuit 230 and communication device 240 are able to effectively reduce or prevent transverse mode spurious responses in the case where Love waves are utilized as a result of being equipped with an acoustic wave resonator, a filter, a duplexer, a multiplexer including three or more filters, and so on, which are realized by applying an acoustic wave device according to the preferred embodiments of the present invention.

Acoustic wave devices, radio-frequency front end circuits, and communication devices according to preferred embodiments of the present invention have been described above with respect to preferred embodiments and a modification thereof, but other preferred embodiments achieved by combining any of the components and elements of the above-described preferred embodiments and modification with one another, modifications obtained by modifying the above-described preferred embodiments in various ways, as thought of by one skilled in the art, without departing from the gist of the present invention, and various devices including a radio-frequency front end circuit and a communication device according to preferred embodiments of the present invention built thereinto are also included in the present invention.

The present invention is able to be widely used in communication devices, such as mobile phone devices, for example, as an acoustic wave resonator, a filter, a duplexer, a multiplexer that is able to be applied to multiband systems, a front end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric body;
   an IDT electrode provided on the piezoelectric body; and
   a first dielectric film provided on the piezoelectric body and covering the IDT electrode; wherein
   the IDT electrode includes a first busbar and a second busbar that face each other, a plurality of first electrode fingers with first ends that are electrically connected to the first busbar, and a plurality of second electrode fingers with first ends that are electrically connected to the second busbar and that are interdigitated with the plurality of first electrode fingers,
   when an acoustic wave propagation direction is a first direction and a direction perpendicular or substantially perpendicular to the acoustic wave propagation direction is a second direction, the IDT electrode includes a crossing region that is a portion of the IDT electrode where the first electrode fingers and the second electrode fingers overlap in the first direction;
   the crossing region includes a center region located in a central portion of the first electrode fingers and the second electrode fingers in the second direction, a first edge region located outside the center region on the first busbar side in the second direction, and a second edge region located outside the center region on the second busbar side in the second direction,
   a first gap region is located outside the first edge region on the first busbar side in the second direction and a second gap region is located outside the second edge region on the second busbar side in the second direction;
   Love waves are utilized as acoustic waves;
   a mass-adding film is provided inside the first dielectric film in the first edge region and the second edge region; and
   when T1 is a film thickness of a portion of the first dielectric film located between the IDT electrode and the mass-adding film and T2 is a film thickness of a portion of the first dielectric film located between the mass-adding film and a surface of the first dielectric film on an opposite side from the piezoelectric body, $T1/(T1+T2)<$about 0.5.

2. The acoustic wave device according to claim 1, wherein an acoustic velocity in the first edge region and the second edge region is lower than an acoustic velocity in the center region and an acoustic velocity in the first gap region and the second gap region is higher than the acoustic velocity in the first edge region and the second edge region.

3. The acoustic wave device according to claim 1, further comprising:

a second dielectric film provided on the first dielectric film; wherein about $0.24 \leq T1/(T1+T2) \leq$ about 0.49 in the first dielectric film.

4. The acoustic wave device according to claim 3, wherein about $0.32 \leq T1/(T1+T2) \leq$ about 0.44 in the first dielectric film.

5. The acoustic wave device according to claim 1, wherein a main component of the mass-adding film is T.

6. The acoustic wave device according to claim 1, wherein the first dielectric film includes silicon oxide.

7. The acoustic wave device according to claim 3, wherein the second dielectric film includes silicon nitride.

8. The acoustic wave device according to claim 1, further comprising:
a second dielectric film provided on the first dielectric film; wherein
a thickness of the second dielectric film is in a range from about $0.005\lambda$ to about $0.015\lambda$, where $\lambda$ is a wavelength defined by an electrode finger pitch of the IDT electrode.

9. A radio-frequency front end circuit comprising:
the acoustic wave device according to claim 1; and
a power amplifier.

10. A communication device comprising:
the radio-frequency front end circuit according to claim 9; and
an RF signal processing circuit.

11. The acoustic wave device according to claim 1, wherein the piezoelectric body includes −20° to 40° Y—X LiNbO$_3$.

12. The acoustic wave device according to claim 1, further comprising at least one reflector located on a side of the IDT electrode in the acoustic wave propagation.

13. The acoustic wave device according to claim 1, wherein the first edge region extends in the acoustic wave propagation direction.

14. The acoustic wave device according to claim 1, wherein the first edge region includes an entirety or substantially an entirety of a region defined by extending tip portions of the IDT electrode in the acoustic wave propagation direction.

15. The acoustic wave device according to claim 1, wherein the second edge region extends in the acoustic wave propagation direction inside the IDT electrode.

16. The acoustic wave device according to claim 1, wherein the second edge region includes tip portions of the plurality of second electrode fingers, base end portions of the plurality of second electrode fingers, regions between the plurality of first electrode fingers, and regions between the plurality of second electrode fingers.

17. The acoustic wave device according to claim 3, wherein the first dielectric film includes a silicon oxide and the second dielectric film includes a silicon nitride.

18. The acoustic wave device according to claim 1, wherein the mass-adding film has a stripe shape that extends in the first direction.

19. The acoustic wave device according to claim 1, wherein the mass-adding film overlaps the plurality of first electrode fingers and the plurality of second electrode fingers.

20. The acoustic wave device according to claim 1, wherein the first dielectric film includes a plurality of protruding portions that extend along a shape of the mass-adding film.

* * * * *